(12) United States Patent
Outram

(10) Patent No.: US 10,627,439 B2
(45) Date of Patent: Apr. 21, 2020

(54) APPARATUS FOR USE IN DISTURBANCE EVALUATION SYSTEMS BASED ON DISTURBANCE EXTRACTION FROM AN ELECTRICAL NETWORK

(71) Applicant: Outram Research Ltd, Bosham (GB)

(72) Inventor: John Douglas Outram, Bosham (GB)

(73) Assignee: Outram Research Ltd, Bosham (GB)

( * ) Notice: Subject to any disclaimer, the term of this patent is extended or adjusted under 35 U.S.C. 154(b) by 217 days.

(21) Appl. No.: 15/032,438

(22) PCT Filed: Nov. 18, 2014

(86) PCT No.: PCT/GB2014/000477
§ 371 (c)(1),
(2) Date: Apr. 27, 2016

(87) PCT Pub. No.: WO2015/075414
PCT Pub. Date: May 28, 2015

(65) Prior Publication Data
US 2016/0274175 A1    Sep. 22, 2016

(30) Foreign Application Priority Data
Nov. 20, 2013 (GB) .................................. 1320544.8

(51) Int. Cl.
*G01R 31/08*    (2020.01)
*G01R 23/00*    (2006.01)
*G01R 23/02*    (2006.01)

(52) U.S. Cl.
CPC ............. *G01R 31/08* (2013.01); *G01R 23/00* (2013.01); *G01R 23/02* (2013.01)

(58) Field of Classification Search
CPC ......... G01R 23/00; G01R 23/02; G01R 31/08
See application file for complete search history.

(56) References Cited

U.S. PATENT DOCUMENTS

| 4,104,687 A * | 8/1978 | Zulaski | .................... H02H 3/36 |
| | | | 361/15 |
| 2002/0072867 A1* | 6/2002 | Parsons | ..................... G06F 1/28 |
| | | | 702/59 |

(Continued)

FOREIGN PATENT DOCUMENTS

| CN | 101154807 A | 4/2008 |
| EP | 0012961 A1 | 7/1980 |

*Primary Examiner* — Yoshihisa Ishizuka
(74) *Attorney, Agent, or Firm* — Iandiorio Teska & Coleman, LLP

(57) ABSTRACT

Apparatus (1) for use in disturbance evaluation systems based on disturbance extraction, which apparatus (1) comprises measuring means for obtaining signal frequency both before (4) and after a disturbance (3) in an electricity network but excluding use of the disturbance transient itself, and interpolation means (5) for interpolating frequency across the disturbance interval to reflect the underlying frequency trend (9) uninfluenced by the disturbance transient. The apparatus (1) may include: (i) at least one delay means (2) for receiving at least one analogue or digital signal (6) from the electricity network; (ii) at least one first access point (P) at a first part of the delay means (2); (iii) at least one second access point (Q) at a second part of the delay means (2), and the apparatus (1) being such that: (iv) the measuring means comprises: (a) a first frequency derivation means (3) for processing a set of access point outputs from the first access point and providing at least one measure of frequency (7) after the disturbance; and (b) a second frequency derivation means (4) for processing a set of access point outputs from the second access point or a delayed output means, for providing at least one measure of frequency (8) before the disturbance; and the interpolation means (5) receives the measure of frequency (7) after the disturbance and the measure of frequency (8) before the disturbance, and provides a measure of frequency (9) as a (Continued)

function of time over a period of interest, which comprises the disturbance interval and either side of the disturbance interval.

6 Claims, 2 Drawing Sheets

(56) References Cited

U.S. PATENT DOCUMENTS

2005/0141682 A1 6/2005 Wells
2010/0264897 A1* 10/2010 Larsson .................... G05F 1/14
 323/304
2013/0116841 A1* 5/2013 Garcia .................. H02J 3/1878
 700/287

* cited by examiner

APPARATUS FOR USE IN DISTURBANCE EVALUATION SYSTEMS BASED ON DISTURBANCE EXTRACTION FROM AN ELECTRICAL NETWORK

This invention relates to apparatus for use in disturbance evaluation systems based on disturbance extraction from an electrical network.

Disturbance evaluation systems based on disturbance extraction are known. The disturbance evaluation systems are used for evaluating disturbances in electrical networks. The disturbance evaluation systems may be used, for example, for fault level monitoring, impedance calculation, and the detection of parallel transformer operation. Known disturbance evaluation systems in the form of fault recorders record fault currents as they occur. These fault recorders are designed to record the actual fault current seen. This is not the fault level, and thus fault recorders are not fault level monitors. Fault level monitors are designed to predict the current which could flow in the worst case.

Fault level monitors are used to predict fault level currents in networks providing electrical power supplies to consumers. The fault level monitors are sometimes known as fault level recorders or by other names. A problem arises in the known fault level monitors when attempts are made to predict fault currents from network disturbances which are very small. The same problem arises in impedance calculation systems, for example impedance mapping systems, where disturbances are used to provide the basis for upstream impedance derivation at different frequencies. The same problem also arises in the detection of parallel transformer operation where disturbances are used to provide the basis for comparison between transformer behaviours, i.e. responses to network activity.

Crucial to accurate calculation of the network impedance from which the fault level can be obtained, is the extraction of the precise differences between the voltage and current signals from before to after the start of the disturbance being exploited. In order to extract this difference information, it is necessary to project the behaviour of the voltage and current signals from before the disturbance to afterwards. This is so that the actual voltage and current signals occurring afterwards can be compared with the projections, thereby revealing the difference information. Successful projection of the behaviour of the voltage and current signals from before to after the start of the disturbance depends heavily on accurate assessment of the frequency of the signals so that the phase of the projections can be correctly represented with respect to the actual voltage and current signals after the disturbance. Where disturbances are small, the accuracy of the frequency assessment for the whole period of interest is critical, and is one of the limiting factors in obtaining accurate fault level results. The extraction of the precise difference information is also crucial to impedance mapping at different frequencies, and to detection of parallel transformer operation.

It is an aim of the present invention to improve the quality of the accuracy of the frequency assessment.

Accordingly, the present invention provides apparatus for use in disturbance evaluation systems based on disturbance extraction, which apparatus comprises measuring means for obtaining signal frequency both before and after a disturbance in an electricity network but excluding use of the disturbance transient itself, and interpolation means for interpolating frequency across the disturbance interval to reflect the underlying frequency trend uninfluenced by the disturbance transient, wherein the apparatus includes:

(i) at least one delay means for receiving at least one analogue or digital signal from the electricity network;

(ii) at least one first access point at a first part of the delay means; and (iii) at least one second access point at a second part of the delay means, and the apparatus is such that:

(iv) the measuring means comprises:
  (a) a first frequency derivation means for processing a set of access point outputs from the first access point and providing at least one measure of frequency after the disturbance; and
  (b) a second frequency derivation means for processing a set of access point outputs from the second access point or a delayed output means, for providing at least one measure of frequency before the disturbance; and (v) the interpolation means receives the measure of frequency after the disturbance and the measure of frequency before the disturbance, and provides a measure of frequency as a function of time over a period of interest comprising a disturbance interval and either side of the disturbance interval.

The apparatus of the present invention enables a snapshot to be obtained of the content of the delay means, the measure of frequency after the disturbance and the measure of frequency before the disturbance. The interpolation means and its frequency output are then able to be used to give accurate frequency data to help obtain disturbance difference information without the frequency data being influenced by the disturbance transient itself. The frequency data is not influenced by the disturbance transient itself because the disturbance transient itself, though now represented within the delay means, is not contributing to either of the derived frequency after the disturbance and the derived frequency before the disturbance. This is because the disturbance data has already passed beyond the last access point of the first set of access point outputs, but has not yet arrived at the first access point of the last set of access outputs.

The analogue input signal may be a voltage signal or a digitised version of the voltage signal. The voltage signal will usually be nominally sinusoidal.

The apparatus may be one in which a first part of the delay means is substantially at the beginning of the delay means, and a second part of the delay means is substantially at the end of the delay means.

The apparatus may be one in which the first access point is a first tap or a first set of taps on a physical delay line, and in which the second access point is a second tap or a second set of taps on the physical delay line. Alternatively, the apparatus may be one in which the first access point is a first access position or a first set of access positions in a memory delay means, and in which the second access point is a second access position or a second set of access positions in the memory delay means. The memory delay means may receive successive samples, with the relevant access positions being implemented by accessing appropriate memory locations.

Embodiments of the invention will now be described solely by way of example and with reference to the accompanying drawings in which.

Successful projection of the behaviour of voltage and current signals from before to after the start of the disturbance in an electrical network depends heavily on accurate assessment of the frequency of the signals. This is because the phase of the projections should be correctly represented with respect to the actual voltage and current signals after the disturbance. Where disturbances are small, the accuracy of the frequency assessment for the whole period of interest is critical. The period of interest is the whole period of time for which a fault level result is desired. The period of interest thus begins at the inception of the disturbance, and runs until after the last instance at which a fault level result is desired. This might be 90 ms or more following the disturbance inception. The disturbance itself generally consists of a transient change which may be abrupt, and which may or may not subsequently collapse to nothing in less time than the period of interest.

In known fault level monitors, and other devices which depend on disturbance evaluation (such for example as devices for impedance mapping at different frequencies and detection of parallel transformer operation), the frequency is derived from one or more signals in the period up to and including the disturbance and the period of interest following it. In one known improvement, the frequency derivation period stops immediately before the disturbance inception, and frequency is assumed to remain constant for the period of interest.

In the present invention, acknowledgement is made that the underlying frequency may be changing during the period of interest. However it has been observed that, to include the disturbance transient itself in the frequency derivation process, can cause severe errors. The present invention therefore proposes that frequency be derived from signals both before the disturbance inception and from a section of time after the disturbance transient is over. By obtaining both results, it is possible to interpolate across the whole period of interest and thereby accommodate underlying frequency changes WITHOUT including the disturbance transient itself in the frequency derivation process.

Figure 1:
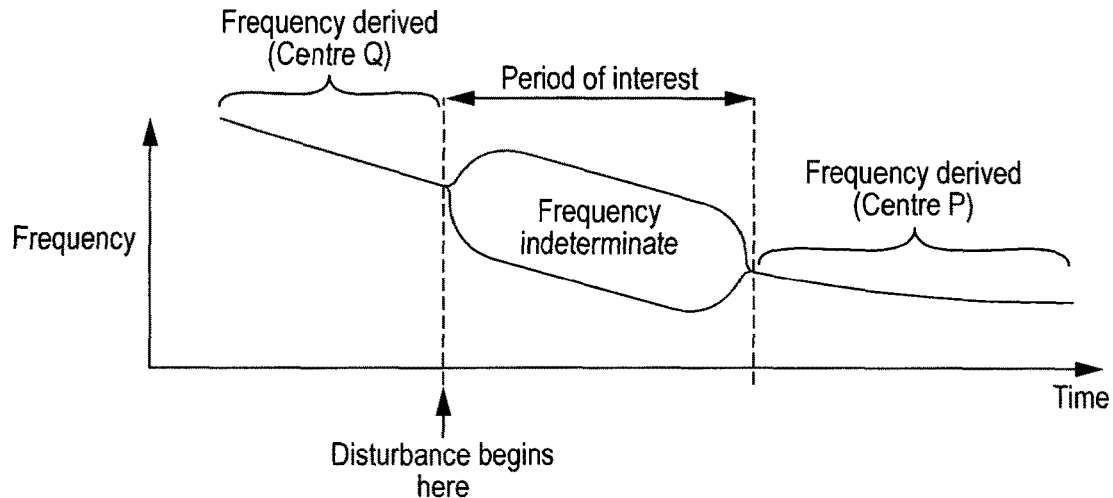
FIG. 1 is a graph of frequency against time.

FIG. 1 is a graph of frequency against time. The graph indicates the change in frequency occurring from before to after the disturbance period of interest. (Note that time advances to the right in the graph so that the section on the left of the graph is the oldest, and the section on the right of the graph is the most recent. This direction is REVERSED in the delay line forming part of the apparatus described below with reference to FIG. 2).

Figure 2:
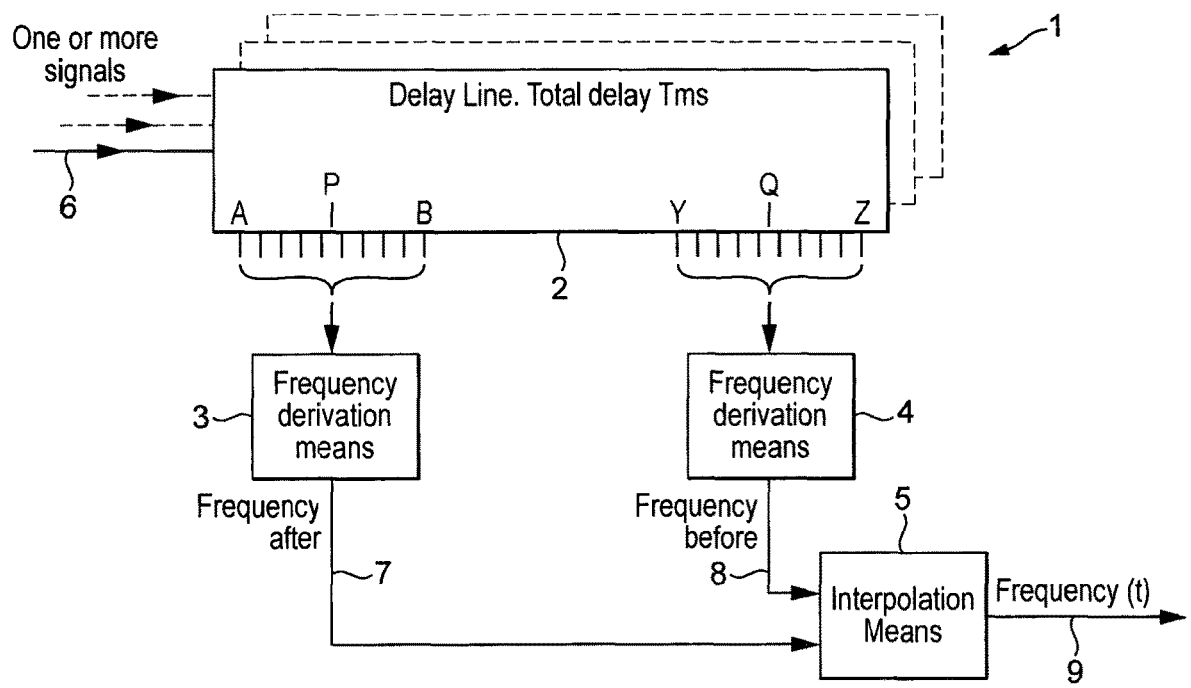
FIG. 2 shows apparatus of the present invention for use in disturbance evaluation systems based on disturbance extraction.

FIG. 2 shows apparatus 1 for use in disturbance evaluation systems based on disturbance extraction. More specifically, the apparatus 1 is for use in fault level monitoring and/or impedance calculation and/or detection of parallel transformer operation. As shown, the apparatus 1 is for obtaining frequency as a function of time over a period of interest and either side of it. Analogue input signals 6, which may be (nominally sinusoidal) voltage signals from an electricity network, are fed into delay means in the form of one or more physical tapped delay lines 2. The following description is confined to a single delay line 2 but it will be appreciated that the apparatus 1 can be duplicated as many times as required to obtain results from more than one signal. It will also be appreciated that the delay means can be in other forms, analogue or digital, or for example a memory delay means that receives successive samples, with the relevant access positions being implemented by appropriate memory locations, or a combination multi-tier approach in which one delay means feeds other delay means.

The delay from one end to the other of the delay line 2 is Tms. At any instant in time, the content of the delay line 2 represents the input signal over the previous (historical) interval Tms long.

Taps are taken from both ends of the delay line 2. More specifically, a closely spaced group of taps P at a first access point at the beginning of the delay line 2 provides a set of access point outputs which is fed to first frequency derivation means 3. The group P set of tap outputs is processed in the first frequency derivation means 3 to produce a measure of frequency 7. The frequency 7 varies with time as new signal data 6 is fed into the delay line 2. Because the taps P are close to the beginning of the delay line 2, these represent the most recent signal data, and the measure of frequency 7 is called the Frequency After Disturbance.

A further closely spaced group of taps Q at a second access point at the other end of the delay line 2 provides a set of access point outputs which is fed to second frequency derivation means 4. The second frequency derivation means 4 provides a further measure of frequency 8. This frequency 8 also varies in time as signal data flows down the delay line 2. However, the signals reach this section Q of the delay line AFTER the signals have been past the section P and after they have passed down the central section of the delay line 2 whose taps are not used. This means that the measure of frequency 8 is necessarily out of date or older than the measure of frequency 7. This measure of frequency 8 is called the Frequency Before Disturbance.

The pair of frequencies 7 and 8 represent the frequency of the signal at two times separated (in time) by the transit delay TtransitPQ down the delay line 2 from group P to group Q. These two frequencies can be combined in interpolation means 5 in varying proportions to produce an effective measure of frequency 9 as a, function of time over the whole time TtransitPQ.

If a snap shot of the delay line content and the derived frequencies 7 and 8 is taken immediately before a disturbance on the signal begins to arrive at the beginning Y of the tap group Q, the interpolation means 5 and its frequency output 9 can be used to give accurate frequency data to help obtain disturbance difference information as discussed above WITHOUT that frequency data being influenced by the disturbance transient itself, which though now represented within the delay line 2, is NOT contributing to either of the derived frequencies 7 or 8, because it has already passed beyond the last tap B contributing to group P, but has not yet arrived at the first tap Y of group Q.

It will be appreciated that the total time delay and the delay across the groups P and Q and the transient time delay TtransitPQ can all be adjusted to suit the likely disturbances and the quality of frequency measurement required as well as the dynamics of frequency excursion.

Furthermore, the delay line may be extended to permit several frequency assessments to be made both before and after the disturbance so that more complex frequency trajectories can be calculated such for example as when a major disturbance actually slows down rotating generator machinery temporarily.

Furthermore, the frequency before disturbance can also be simply an appropriately delayed version of the frequency after disturbance, i.e. the second frequency derivation means 4, while shown for clarity, may be substituted with an already calculated result.

Figure 3:
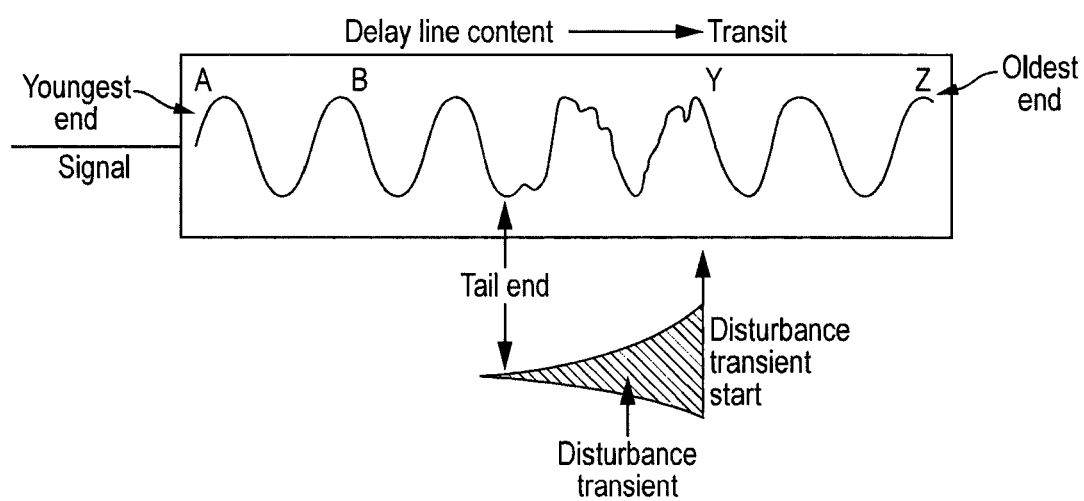
FIG. 3 illustrates the operation of the apparatus shown in FIG. 2.

FIG. 3 shows the signal 6 entering the delay line 2 at the youngest end at tap A. The oldest end is at tap Z. The disturbance transient position is shown as being approximately in the centre of the delay line 2.

It is to be appreciated that the embodiments of the invention described above with reference to the accompanying drawings have been given by way of example only and that modifications may be effected. Thus, for example, the embodiments shown and described with reference to the drawings can be used for impedance calculation systems, for example for impedance mapping systems and/or detection of parallel transformer operation. The delay line 2 may alternatively be a memory delay means. Individual components shown in the drawings are not limited to use in their drawings and they may be used in other drawings and in all aspects of the invention.

The invention claimed is:

1. Apparatus for use in disturbance evaluation systems based on disturbance extraction, which apparatus comprises:
   (i) measuring means for obtaining signal frequency both before and after a disturbance in an electricity network but excluding use of a disturbance transient;
   (ii) interpolation means for interpolating frequency across the disturbance to reflect the underlying frequency trend uninfluenced by the disturbance transient;
   (iii) at least one delay means for receiving at least one analogue or digital signal from the electricity network;
   (iv) at least a first tap or a first set of taps on a physical delay line at a first part of the at least one delay means; and
   (v) at least a second tap or a second set of taps on the physical delay line at a second part of the at least one delay means,
   (vi) wherein the measuring means comprises:
   (a) a first frequency derivation means for processing a set of access point outputs from the at least first tap or first set of taps on the physical delay line and providing at least one measure of frequency after the disturbance; and
   (b) a second frequency derivation means for processing a set of access point outputs from the at least second tap or the second set of taps on the physical delay line or a delayed output means, for providing at least one measure of frequency before the disturbance; and
   (vii) wherein the interpolation means receives the provided at least one measure of frequency after the disturbance and the provided at least one measure of frequency before the disturbance, and which provides a measure of frequency as a function of time over a period comprising the disturbance and either side of the disturbance.

2. Apparatus according to claim 1 in which the at least one analogue signal is a voltage signal, or a digitised version of the voltage signal.

3. Apparatus according to claim 1 in which the first part of the at least one delay means is at the beginning of the at least one delay means, and in which the second part of the at least one delay means is at the end of the at least one delay means.

4. Apparatus for use in disturbance evaluation systems based on disturbance extraction, which apparatus comprises:
   (i) measuring means for obtaining signal frequency both before and after a disturbance in an electricity network but excluding use of a disturbance transient;
   (ii) interpolation means for interpolating frequency across the disturbance to reflect the underlying frequency trend uninfluenced by the disturbance transient;
   (iii) at least one delay means for receiving at least one analogue or digital signal from the electricity network;
   (iv) at least a first access position or a first set of access positions in a memory delay means at a first part of the at least one delay means; and
   (v) at least a second access position or a second set of access positions in the memory delay means at a second part of the at least one delay means,
   (vi) wherein the measuring means comprises:
   (a) a first frequency derivation means for processing a set of access point outputs from the at least first access position or the first set of access positions in the memory delay means and providing at least one measure of frequency after the disturbance; and
   (b) a second frequency derivation means for processing a set of access point outputs from the at least second access position or the second set of access positions in the memory delay means or a delayed output means, for providing at least one measure of frequency before the disturbance; and
   (vii) wherein the interpolation means receives the provided at least one measure of frequency after the disturbance and the provided at least one measure of frequency before the disturbance, and which provides a measure of frequency as a function of time over a period comprising the disturbance and either side of the disturbance.

5. Apparatus according to claim 4 in which the at least one analogue signal is a voltage signal, or a digitised version of the voltage signal.

6. Apparatus according to claim 4 in which the first part of the at least one delay means is at the beginning of the delay means, and in which the second part of the at least one delay means is at the end of the delay means.

\* \* \* \* \*